(12) United States Patent
Ishizaki

(10) Patent No.: US 10,580,460 B2
(45) Date of Patent: Mar. 3, 2020

(54) ELECTRONIC DEVICE HAVING CIRCUIT BOARD INCLUDING THIRD CONDUCTORS INSULATED FROM FIRST AND SECOND CONDUCTORS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kiyokazu Ishizaki, Inagi Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/905,737

(22) Filed: Feb. 26, 2018

(65) Prior Publication Data

US 2019/0115051 A1 Apr. 18, 2019

(30) Foreign Application Priority Data

Oct. 13, 2017 (JP) .................................. 2017-199787

(51) Int. Cl.
*G11B 33/12* (2006.01)
*G11B 33/14* (2006.01)
(Continued)

(52) U.S. Cl.
CPC ........ *G11B 33/1446* (2013.01); *G11B 25/043* (2013.01); *G11B 33/122* (2013.01);
(Continued)

(58) Field of Classification Search
CPC .. H05K 1/0224; H05K 1/0225; H05K 1/0227; H05K 1/144; H05K 1/145; G11B 33/122
(Continued)

(56) References Cited

U.S. PATENT DOCUMENTS

| 8,098,454 B2 * | 1/2012 | Kouno ............... G11B 33/1466 360/99.21 |
| 8,432,706 B2 * | 4/2013 | Kim ..................... H05K 1/0236 174/250 |
| 9,007,779 B2 | 4/2015 | Yamamoto et al. |

(Continued)

FOREIGN PATENT DOCUMENTS

JP 2006147726 A 6/2006

*Primary Examiner* — Jefferson A Evans
(74) *Attorney, Agent, or Firm* — Kim & Stewart LLP

(57) ABSTRACT

An electronic device includes a housing having a first opening, an electric component in the housing, and a circuit board attached to the housing, having as outer surface, covering the first opening, and at least partially exposed to an outside of the housing. The circuit board includes first conductors exposed to the outside of the housing, and a second conductor that extends along the outer surface and is insulated from the plurality of first conductors. The electronic device further includes a connector mounted in the outer surface. The connector includes contactors electrically connected to the first conductors, and a support base having a second opening and supporting the contactors so as to be elastically deformable. The circuit board includes third conductors at positions overlapping the contactors. The third conductors are insulated from the first conductors and the second conductor, and provide gas sealing or electromagnetic shielding effects.

18 Claims, 6 Drawing Sheets

(51) Int. Cl.
*H01R 12/71* (2011.01)
*H05K 1/14* (2006.01)
*H05K 1/11* (2006.01)
*G11B 25/04* (2006.01)
*H01R 13/24* (2006.01)
*H05K 1/02* (2006.01)

(52) U.S. Cl.
CPC ......... *H01R 12/714* (2013.01); *H01R 12/716* (2013.01); *H01R 13/2435* (2013.01); *H05K 1/0224* (2013.01); *H05K 1/0225* (2013.01); *H05K 1/0227* (2013.01); *H05K 1/111* (2013.01); *H05K 1/144* (2013.01); *H05K 1/145* (2013.01); *H05K 2201/094* (2013.01); *H05K 2201/09409* (2013.01); *H05K 2201/09445* (2013.01); *H05K 2201/10189* (2013.01)

(58) Field of Classification Search
USPC .......................................... 360/99.23, 99.25
See application file for complete search history.

(56) References Cited

U.S. PATENT DOCUMENTS

| | | | |
|---|---|---|---|
| 9,196,303 B2 | 11/2015 | Hirano et al. | |
| 9,490,620 B1* | 11/2016 | Albrecht | G11B 33/14 |
| 9,886,985 B1* | 2/2018 | Okamoto | G11B 33/027 |
| 2003/0022533 A1* | 1/2003 | Joo | G11B 5/4853 |
| | | | 439/67 |
| 2005/0130457 A1* | 6/2005 | Nozaki | G11B 25/043 |
| | | | 439/67 |
| 2010/0328815 A1 | 12/2010 | Nakatsuka et al. | |
| 2017/0244193 A1* | 8/2017 | Kondo | H01R 13/504 |
| 2018/0263109 A1* | 9/2018 | Chen | H05K 1/0225 |
| 2018/0331474 A1* | 11/2018 | Ju | H01R 12/7082 |
| 2018/0366163 A1* | 12/2018 | Amin-Shahidi | G11B 33/126 |

* cited by examiner

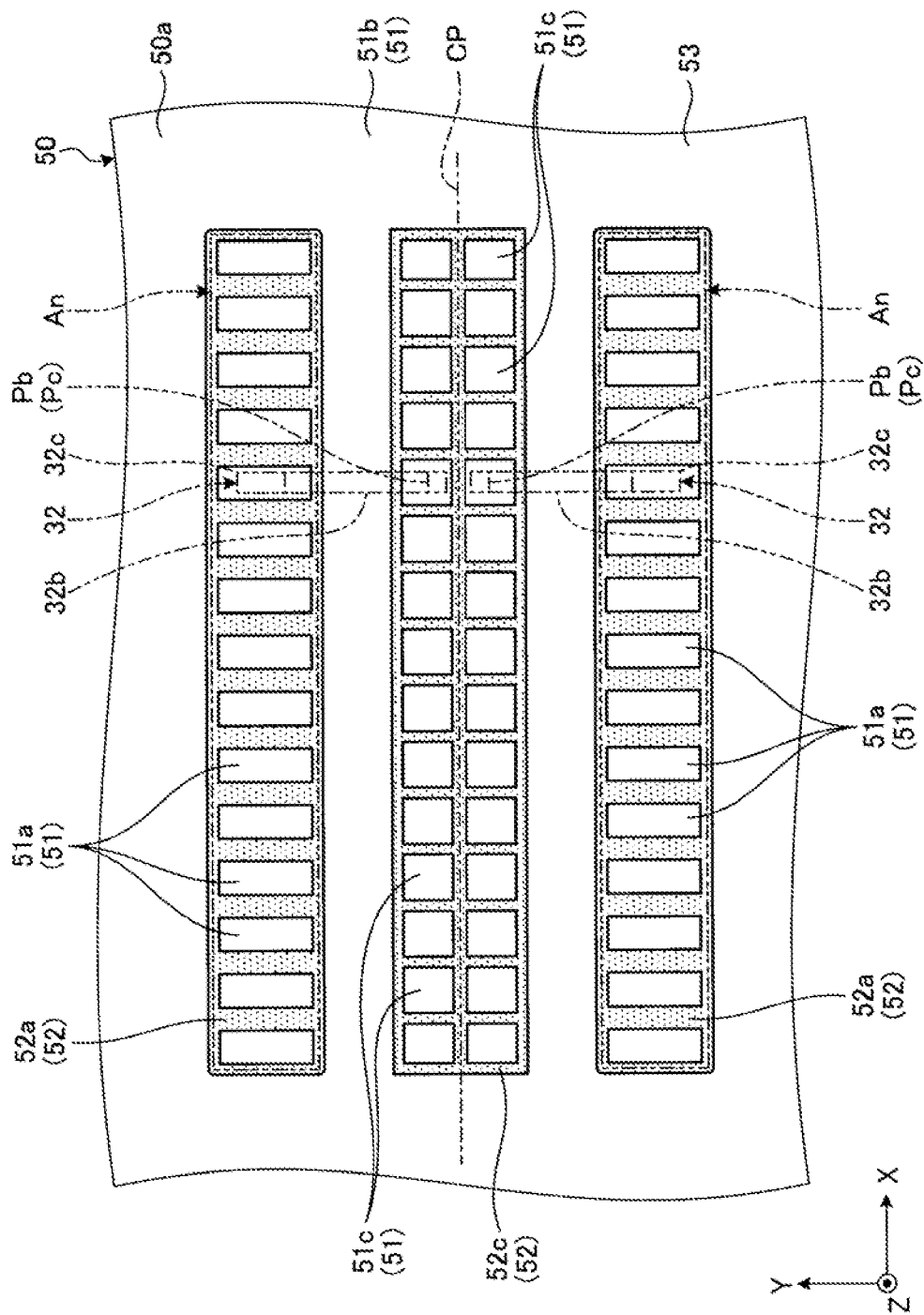

ELECTRONIC DEVICE HAVING CIRCUIT BOARD INCLUDING THIRD CONDUCTORS INSULATED FROM FIRST AND SECOND CONDUCTORS

CROSS-REFERENCE TO RELATED APPLICATION

This application is based upon and claims the benefit of priority from. Japanese Patent Application No. 2017-199787, filed Oct. 13, 2017, the entire contents of which are incorporated herein by reference.

FIELD

An embodiment described herein relates generally to an electronic device.

BACKGROUND

In the related art, there is known an electronic device which accommodates an electronic component in a housing.

DESCRIPTION OF THE DRAWINGS

FIG. 6 is a top view schematically illustrating an example of a conductor pattern which is provided in a circuit board of the electronic device of the embodiment.

DETAILED DESCRIPTION

Embodiments provide an electronic device of a novel configuration having fewer defects in a portion where a conductor passes through a housing, for example.

In general, according to one embodiment, the electronic device includes a housing having a first opening, an electric component in the housing, and a circuit board attached to the housing having an outer surface that covers the first opening and at least partially exposed to an outside of the housing. The circuit board includes a plurality of first conductors exposed to the outside of the housing in the outer surface, and a second conductor that extends along the outer surface and is insulated from the plurality of first conductors. The electronic device further includes a first connector mounted in the outer surface. The first connector includes a plurality of contactors electrically connected to the plurality of first conductors, and a support base having a second opening through the circuit board in a thickness direction and elastically deformable in the second opening. The circuit board includes a plurality of third conductors at positions overlapping the plurality of contactors and insulated from the plurality of first conductors and the second conductor.

Hereinafter, an embodiment of the electronic device will be disclosed. The configurations (technical features) of the following embodiment are given as an example. Further, the respective drawings are schematically illustrated, and dimensions may be different from an actual configuration.

Figure 1:
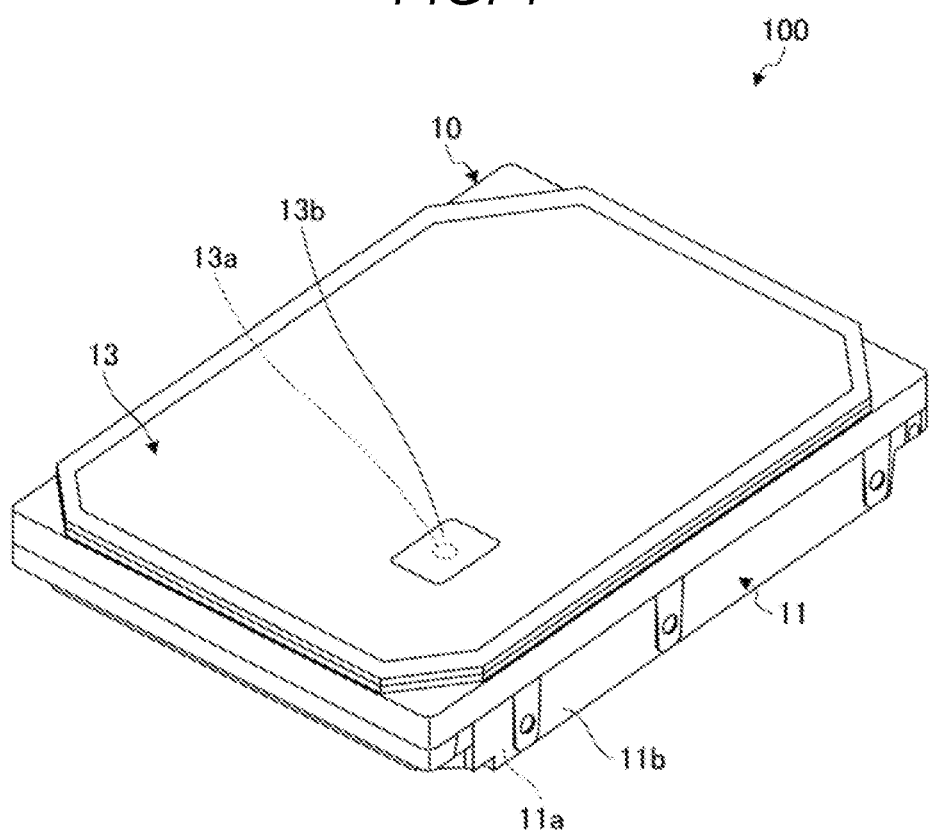
FIG. 1 is a perspective view schematically illustrating an example of an electronic device of an embodiment.
Figure 2:
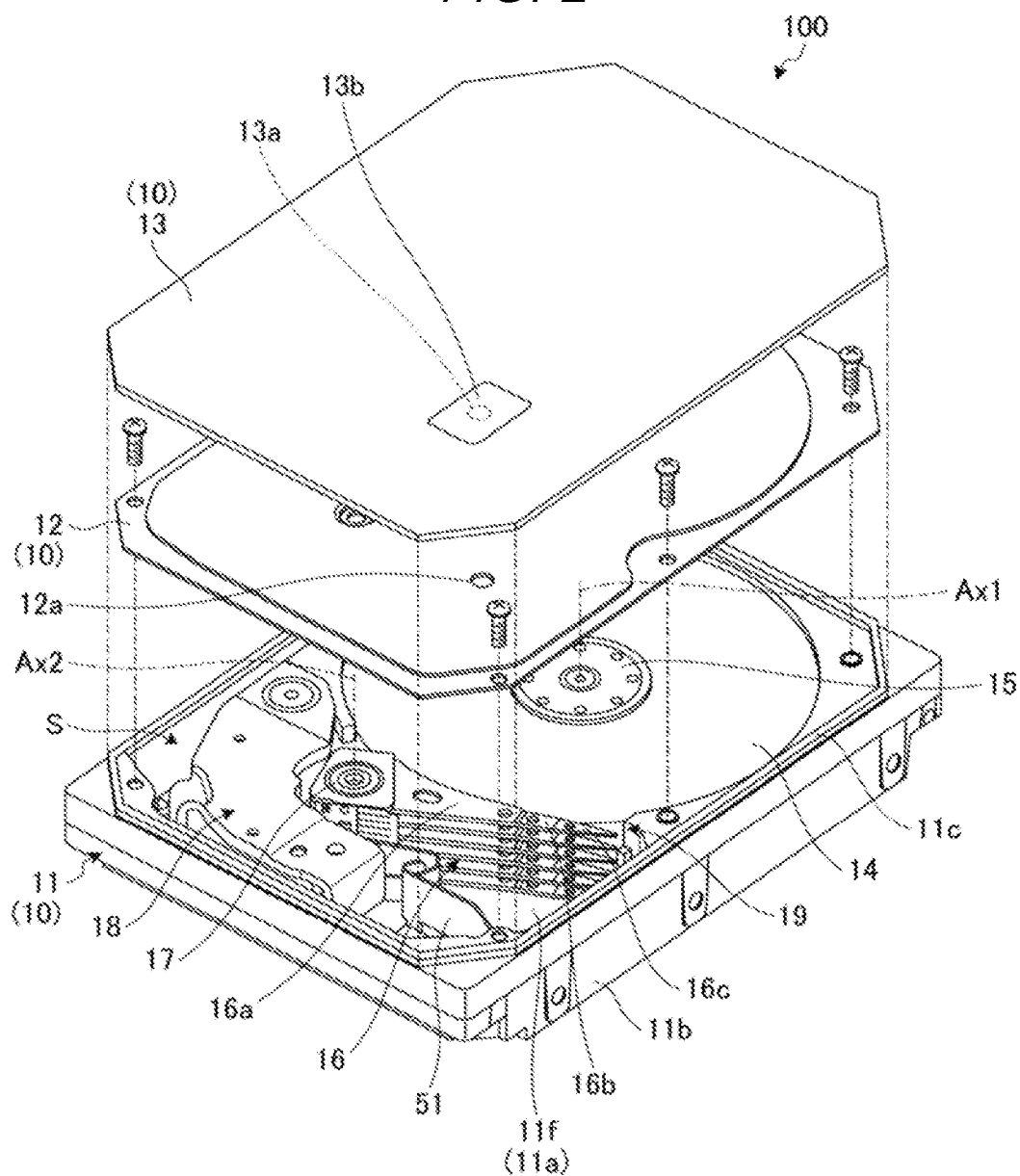
FIG. 2 is an exploded perspective view schematically illustrating an example of the electronic device of the embodiment.

FIG. 1 is a perspective view illustrating an outer appearance of a hard disk drive 100 (HDD), and FIG. 2 is an exploded perspective view of the HDD 100. As illustrated in FIG. 1, the HDD 100 includes a housing 10 of a rectangular flat shape. In addition, as illustrated in FIG. 2, the housing 10 includes a base 11, an inner cover 12, and an outer cover 13. The HDD 100 is an example of the electronic device.

The base 11 is a bottomed vessel, a bottom wall 11a, and a peripheral wall 11b. The shape of the bottom wall 11a is a square shape or a plate shape. The shape of the peripheral wall 11b is a plate shape, and the peripheral wall 11b protrudes from the periphery of the bottom wall 11a at a substantially constant height. The bottom wall 11a and the peripheral wall 11b are integrally formed of a metal material such as an aluminum alloy.

As illustrated in FIG. 2, an inner space S of the base 11 is covered with the inner cover 12 and the outer cover 13. The inner cover 12 is fixed to the upper surface of the peripheral wall 11b by a coupling tool such as a screw. In addition, the outer cover 13 is fixed to an edge 11c of the peripheral wall 11b by welding in the state of covering the inner cover 12. The outer cover 13 and the peripheral wall 11b are bonded to prevent a gas leakage. In the embodiment, the bottom wall 11a, the peripheral wall 11b, and the outer cover 13 are examples of the outer wall.

In the inner cover 12 and the outer cover 13, holes 12a and 13a are provided respectively. After components are attached in the inner portion of the base 11, the inner cover 12 and the outer cover 13 are attached to the base 11, and the housing 10 is assembled, the air in the housing 10 is pulled out of the vent holes 12a and 13a, and instead the housing 10 is filled with a gas different from the air. The gas filling in the housing 10 is a gas having a density lower than that of the air for example, or an inert gas having a low responsiveness. Helium may be used for example, but the invention is not limited thereto. The vent hole 13a of the outer cover 13 is closed by a seal 13b, and prevents the gas that fills the vent hole 13a from leaking out. In this manner, in a state where the HDD 100 is assembled, the housing 10 seals air-tightly, and a gas different from air is enclosed in the housing 10. Further, the housing 10 may be kept in a vacuum state or a state near the vacuum state, or may be kept at a pressure lower than atmospheric pressure.

As illustrated in FIG. 2, a magnetic disk 14 and a spindle motor 15 are accommodated in the housing 10. The spindle motor 15 is supported by the bottom wall 11a, and rotatably drives the magnetic disk 14 at a predetermined rotation speed about a rotation center Ax1 which intersects (perpendicularly) with the bottom wall 11a. The magnetic disk 14 is attached to a hub (not illustrated) of the spindle motor 15 concentrically to each other. The number of magnetic disks 14 may be one or may be plural. As illustrated in the example of FIG. 2, in a case where a plurality of magnetic disks 14 is provided, these magnetic disks 14 are disposed in parallel with each other, and in parallel with the bottom wall 11a.

A head assembly 16 provided in the housing 10 is supported to the bottom wall 11a through a bearing 17 disposed on the outside in a radius direction of the magnet disk 14 to be rotatable about a rotation center Ax2 which is parallel with the rotation center Ax1. The head assembly 16 includes an arm 16a which extends along the bottom wall 11a. The number of arms 16a is the same as that of the magnetic disks 14. In the edge of the arm 16a, a magnetic head 16c is attached through a suspension 16b. The magnetic head 16c and the magnetic disk 14 are examples of the electric component.

In addition, in the housing 10, a voice coil motor 18 (VCM) and a ramp load mechanism 19 are provided. The VCM 18 controls the rotation and the positioning of the head assembly 16. The ramp load mechanism 19 keeps the magnetic head 16c at an unload position which is separated from the magnetic disk 14. The VCM 18 is an example of the electric component.

Figure 3:
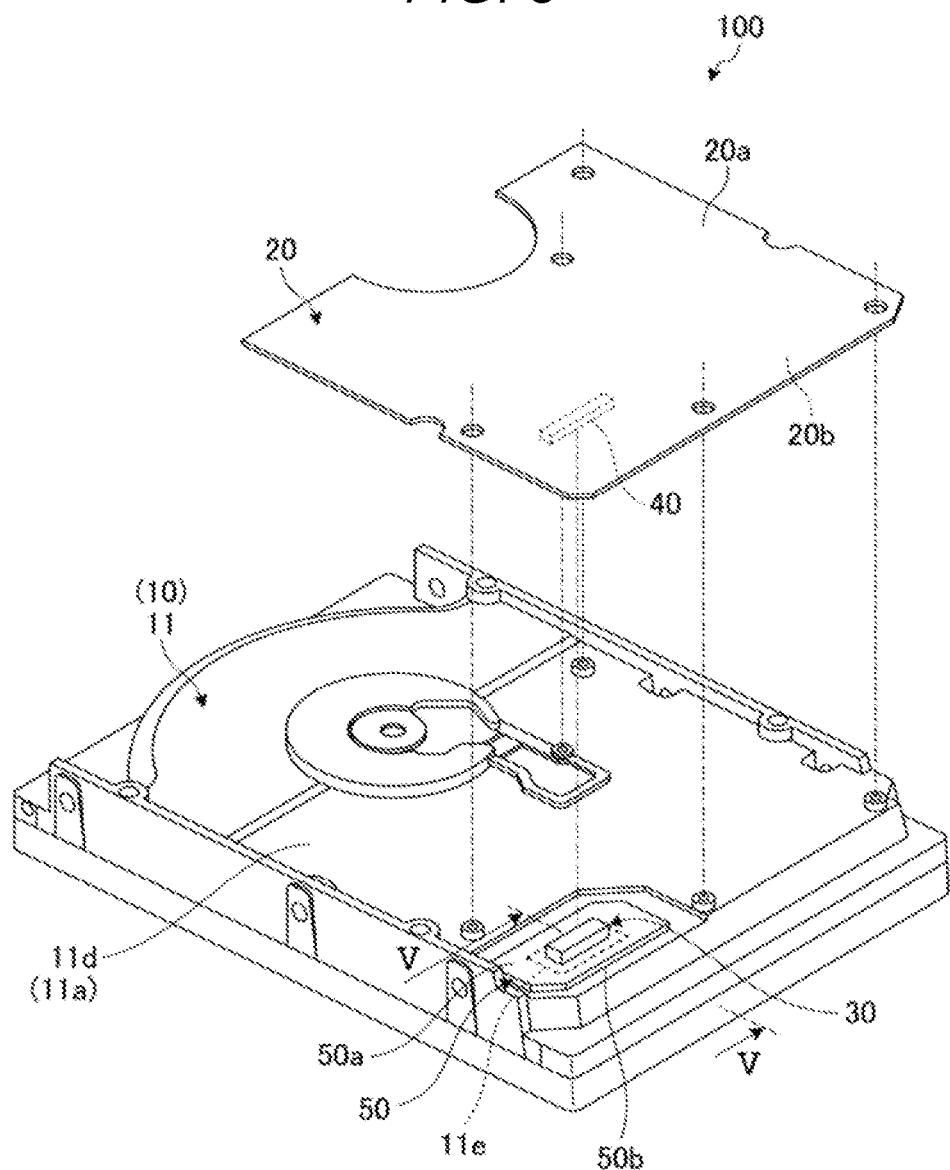
FIG. 3 is an exploded perspective view schematically illustrating an example of the electronic device of the embodiment when viewed from the opposite side to FIG. 2.

FIG. 3 is an exploded perspective view of the HDD 100 when viewed from the opposite side of FIG. 2. As illustrated in FIG. 3, a printed circuit board 20 (PCB) is attached on an outer surface 11d of the bottom wall 11a of the base 11 with a gap with respect to the bottom wall 11a. The PCB 20 is, for example, a rigid board such as a glass epoxy board, or a multilayered board or a build-up board, but the invention is not limited thereto. The PCB 20 is also called a circuit board. The PCB 20 includes a first surface 20a and a second surface 20b. The PCB 20 is fixed to the base 11 by a coupling tool such as a screw or a rivet, a snap-fit mechanism such as an elastic hook in a state where the second surface 20b faces the outer surface 11d, and the first surface 20a is exposed. In the PCB 20, the electric components (not illustrated) such as ICs, coils, capacitors, and resistors are mounted. A control board is configured to control the operations and the calculation processes of the HDD 100 together with the electric components and wirings provided in the PCB 20.

A first connector 30 is mounted in a printed circuit board 50 (PCB). The PCB 50 is, for example, a rigid board such as a glass epoxy board, or a multilayered board or a build-up board, but the invention is not limited thereto. The first connector 30 is also called a circuit board. The PCB 50 is an example of the circuit board.

The PCB 50 is provided to cover a through hole 11e which is provided in the bottom wall 11a. The PCB 50 is fixed to the base 11 by a mechanical engagement by a coupling tool such as a screw or a rivet or by bonding using an adhesive. As described above, in a case where the gas is enclosed in the housing 10, or the housing 10 is kept at a pressure lower than the atmospheric pressure, the PCB 50 is fixed to the base by an air-tight scheme and structure such that the gas in the housing 10 is not leaked out to the housing 10 through the through hole 11e, or the gas outside the housing 10 does not enter the housing 10. For the securing of airtightness, a seal member such as an elastomer or a sealing agent having a high airtightness may be interposed between the PCB 50 and the bottom wall 11a. The through hole 11e is an example of the first opening. The PCB 50 may be also called a relay board or a connection board.

The PCB 50 includes a first surface 50a and a second surface 50b. The first surface 50a is exposed to the outside of the housing 10, and faces the second surface 20b of the PCB 20. The second surface 50b is provided on the opposite side to the first surface 50a. Part of the second surface 50b is exposed toward the inside of the housing 10 through the through hole 11e. A peripheral portion of the through hole 11e in the second surface 50b and the outer surface 11d of the bottom wall 11a are secured with airtightness therebetween. The first surface 50a is an example of the outer surface.

Further, the PCB 50 may be fixed to the inner surface inside the housing 10 of the bottom wall 11a, and cover the through hole 11e from the inside of the housing 10. In this case, part of the first surface 50a is exposed to the outside of the housing 10 through the through hole 11e, and the second surface 50b is exposed toward the inside the housing 10.

The first connector 30 is mounted in the first surface 50a of the PCB 50. A second connector 40 is mounted in the second surface 20b of the PCB 20. The PCB 20 is attached to the housing 10 in a state where the first connector 30 and the second connector 40 are mechanically and electrically connected to each other.

Control signals and data are transferred between the PCB 20 and the magnetic head 16c and between the PCB 20 and the VCM 18 through the first connector 30, the second connector 40, and a flexible printed wiring board 51 (FIG. 2).

Figure 4:
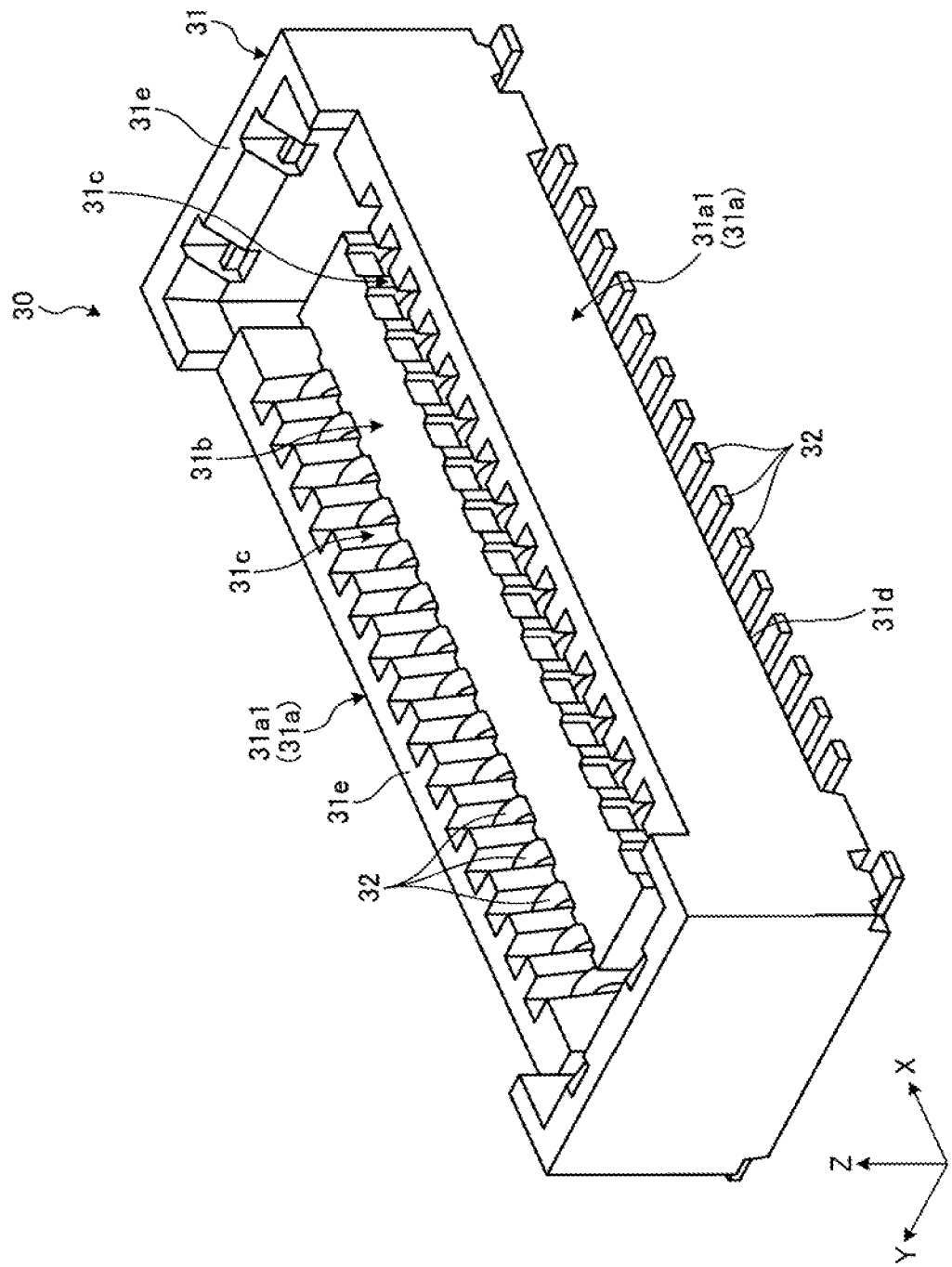
FIG. 4 is a perspective view schematically illustrating an example of a connector of the electronic device of the embodiment.

FIG. 4 is a perspective view of the first connector 30. In FIG. 4, an X direction, a Y direction, and a Z direction are illustrated for the convenience. The X direction is a longitudinal direction of the first connector 30, the Y direction is a width direction (short direction) of the first connector 30, and the Z direction is a height direction (thickness direction) of the first connector 30. In the following, the longitudinal direction of the first connector 30 will be simply referred to as the longitudinal direction, the width direction of the first connector 30 will be simply referred to as the width direction, and the height direction of the first connector 30 will be simply referred to as the height direction. Further, the Z direction is the thickness direction of the PCB 50 in which the first connector 30 is mounted, and also a normal direction of the first surface 50a of the PCB 50. The X direction, the Y direction, and the Z direction are perpendicular to each other.

As illustrated in FIG. 4, the first connector 30 includes a support base 31 and a plurality of first contactors 32. The first contactor 32 is an example of a contactor.

The support base 31 has a thin and long rectangular shape. The support base 31 includes a peripheral wall 31a of a square or frame shape and a center wall 31b which extends in the longitudinal direction in the center of the width direction. Two concave portions 31c (concave portion) which extend along the longitudinal direction are provided between two side walls 31a1 which extend in the longitudinal direction on both sides in the width direction in the peripheral wall 31a and the center wall 31b.

The support base 31 includes a first surface 31d and a second surface 31e. The first surface 31d faces the first surface 50a of the PCB 50 with a gap therebetween. The second surface 31e is in parallel with the first surface 31d, and is located on the opposite side to the PCB 50 with respect to the first surface 31d.

The plurality of first contactors 32 is fixed to the support base 31. The plurality of first contactors 32 is arranged in the longitudinal direction at almost constant intervals. The first connector 30 includes a row of the first contactors 32 exposed in one of two concave portions 31c, and a row of the first contactors 32 exposed in the other concave portion 31c.

The support base 31 is formed of an insulating synthetic resin material. The plurality of first contactors 32 is integrally formed with the support base 31 by a so-called insert molding to mold the support base 31 in a state where the plurality of first contactors 32 is held at predetermined positions in a metal mold for example. Further, the plurality of first contactors 32 may be integrally formed with the support base 31 by being pressed into the support base 31 for example.

Figure 5:
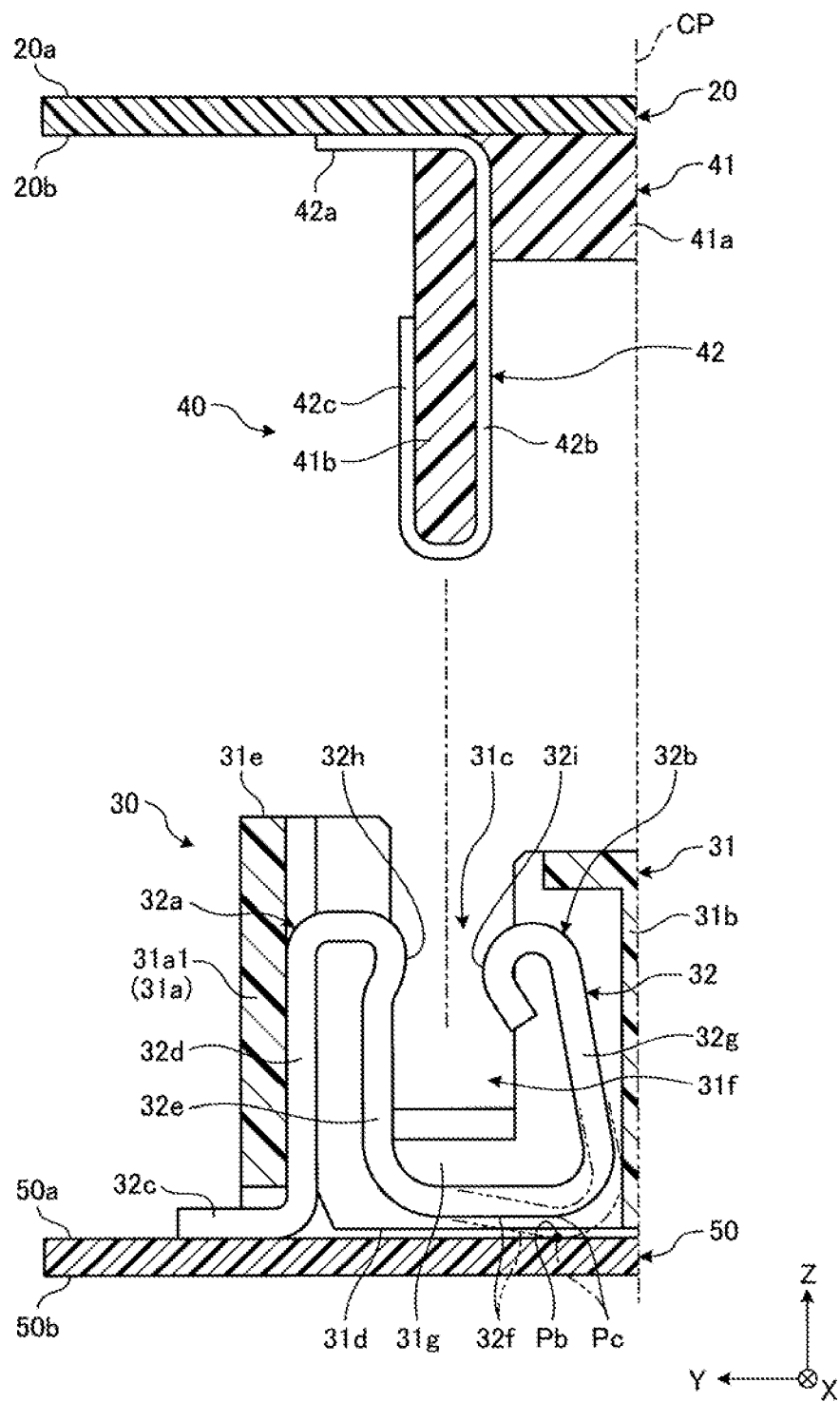
FIG. 5 is an exploded cross-sectional view schematically illustrating an example of the connector of the electronic device of the embodiment and another connector which is connected to the connector, which is taken along line V-V of FIG. 3.

FIG. 5 is an exploded cross-sectional view of the first connector 30 mounted in the PCB 50 and the second connector 40 mounted in the PCB 20. Further, FIG. 5 illustrates only a structure on one side of a plane CP passing through the center in the width direction of the first connector 30 and the second connector 40. The structure on the other side in the width direction is symmetrical to the structure on one side in the width direction, and thus it will be omitted in FIG. 5. In addition, the X direction, the Y direction, and the Z direction are the same as FIG. 4.

In the first connector 30, the first contactor 32 extends while being bent substantially along the height direction and the width direction (that is, an YZ plane) with an almost constant width (the width of the first connector 30 in the longitudinal direction). The first contactor 32 includes a fixing portion 32a which is fixed to the support base 31, and a movable portion 32b which is accommodated in a space 31f between the side wall 31a1 and the center wall 31b to be elastically bendable from the fixing portion 32a.

The fixing portion 32a is fixed to the side wall 31a1 (peripheral wall 31a) of the support base 31. In other words, the side wall 31a1 supports the fixing portion 32a of the first contactor 32. The fixing portion 32a includes a connection end 32c and a held portion 32d.

The connection end 32c extends substantially along the width direction, and exposed to the outside of the support base 31 from the side wall 31a1. The connection end 32c is connected to a first conductor 51a (see FIG. 6) exposed to the first surface 50a of the PCB 50 with a solder.

The held portion 32d is buried in the side wall 31a1 or interposed in a groove portion or an opening (not illustrated) provided in the side wall 31a1, so as to be fixed to the side wall 31a1. The held portion 32d is bent to form an approximate L shape together with the connection end 32c from the end near the center wall 31b of the connection end 32c, and extends substantially along the height direction to be separated from the first surface 50a of the PCB 50.

The movable portion 32b protrudes from the side wall 31a1 into the space 31f provided in the support base 31. The space 31f includes the concave portion 31c and a plurality of through holes 31g. The through hole 31g is provided between the side wall 31a1 and the center wall 31b, and passes through the support base 31 in the height direction between the first surface 31d and the second surface 31e of the concave portion 31c. The shape of the through hole 31g is a slit shape. The width of the through hole 31g (the width of the first connector 30 in the longitudinal direction) is set to be wider than the width of the movable portion 32b. Therefore, the movable portion 32b can be elastically deformed in the space 31f. The through hole 31g is an example of the second opening.

In addition, the movable portion 32b has a shape in which a root portion 32e, an intermediate portion 32f, and an edge portion 32g are connected in an approximate U shape.

The root portion 32e is bent to form an approximate inverted-U shape together with the held portion 32d from the end separated from the first surface 50a of the PCB 50 of the held portion 32d, and extends substantially along the height direction to approach the first surface 50a.

The intermediate portion 32f is bent to form an approximate L shape together with the root portion 32e from the end near the first surface 50a of the root portion 32e, and extends substantially along the width direction in substantially parallel with the first surface 50a.

The edge portion 32g is bent to form an approximate L shape together with the intermediate portion 32f from the end near the center wall 31b of the intermediate portion 32f, and extends substantially along the height direction to be separated from the first surface 50a. The end separated from the first surface 50a of the edge portion 32g is bent in an approximate inverted-U shape.

The second connector 40 includes a support base 41 and a plurality of second contactors 42.

The support base 41 is a thin and long rectangular shape which extends in the longitudinal direction. The support base 41 includes a rectangular bottom wall 41a, and two side walls 41b which extend along the longitudinal direction while protruding from both ends of the bottom wall 41a in the width direction in a direction separated from the second surface 20b of the PCB 20. Two side walls 41b are parallel with each other. The side wall 41b may be called a protrusion portion or an insertion portion.

The plurality of second contactors 42 is fixed to the support base 41. In each of two side walls 41b, the plurality of second contactors 42 is in parallel with the longitudinal direction at almost constant intervals. A layout interval of the first contactors 32 is the same as that of the second contactors 42. Therefore, the first contactor 32 and the second contactor 42 are electrically connected to each other in a state where the first connector 30 and the second connector 40 are engaged.

The second contactor 42 extends while being bent substantially along the height direction and the width direction (that is, the YZ plane) with an almost constant width (the width of the second connector 40 in the longitudinal direction). The second contactor 42 includes a connection end 42a, a protrusion portion 42b, and a folded portion 42c.

The connection end 42a extends substantially along the width direction, and exposed from the bottom wall 41a to the outside of the support base 41. The connection end 42a is connected to the second surface 20b of the PCB 20 by a solder.

The protrusion portion 42b is bent to form an approximate L shape together with the connection end 42a from the end near the center portion (plane CP) in the width direction of the bottom wall 41a of the connection end 42a, and extends separately from the second surface 20b of the PCB 20 substantially along the height direction. In addition, the protrusion portion 42b extends along the inside surface in the width direction of the side wall 41b of the support base 41, and is exposed toward the inside in the width direction.

The folded portion 42c is bent to cover the end of the side wall 41b and to form an approximate U shape together with the protrusion portion 42b in the end separated from the edge of the protrusion portion 42b (that is, the second surface 20b), and extends substantially along the height direction to approach the second surface 20b. In addition, the folded portion 42c extends along the outside surface in the width direction of the side wall 41b, and is exposed to the outside in the width direction.

The support base 41 is formed of a conductive synthetic resin material. The plurality of second contactors 42 are integrally formed with the support base 41 by a so-called insert molding in which the support base 41 is molded in a state where the plurality of second contactors 42 is held in predetermined positions in a metal mold for example. Further, the plurality of second contactors 42 may be integrally formed with the support base 41 by being pressed into the support base 41 for example.

While not illustrated in the drawing, in amounting state of the first connector 30 and the second connector 40, the side wall 41b of the second connector 40 is inserted into the concave portion 31c of the first connector 30. Therefore, the first connector 30 is also called a receptacle (connector), and the second connector 40 is also called a plug (connector).

In addition, in the mounting state, a contact portion 32h disposed in the root portion 32e of the first contactor 32 in the first connector 30 comes into contact with the folded portion 42c of the second contactor 42 of the second connector 40, and the contact portion 32i disposed near the edge of the edge portion 32g of the first contactor 32 comes into contact with the protrusion portion 42b of the second contactor 42. Therefore, the first contactor 32 and the second contactor 42 become electrically connected. In this case, the first contactor 32 elastically presses the second contactor 42 to be elastically interposed while being elastically deformed.

Herein, as described above, the movable portion 32b of the first contactor 32 is accommodated in the space 31f of the support base 31 in an elastically deformable state. Therefore, when the side wall 41b of the second connector 40 is inserted to the concave portion 31c of the first connector 30, the first contactor 32 is pressed to the lower side of FIG. 5 by the second contactor 42 provided in the side wall 41b, and elastically deformed to approach the first surface 50a of the PCB 50 as illustrated by a two-dot chain line in FIG. 5 so as to come into contact with the first surface 50a. A contact position Pc of the first contactor 32 with respect to the first surface 50a is in the intermediate portion 32f. In addition, the first surface 50a comes into contact with the contact position Pc in a contact position Pb.

FIG. 6 is a top view illustrating a conductor pattern 51 which is provided in the vicinity of the first surface 50a of the PCB 50. As illustrated in FIG. 6, the PCB 50 includes the first conductor 51a, a second conductor 51b, and a third conductor 51c as the conductor pattern 51 in the vicinity of the first surface 50a. The first conductor 51a, the second conductor 51b, and the third conductor 51c are formed of a metal material such as copper-based metal.

The first conductor 51a is exposed to the first surface 50a. The shape of the first conductor 51a is a rectangular shape which is long in the width direction. The connection end 32c of the first contactor 32 is electrically connected to the first conductor 51a by a solder. Therefore, a plurality of first conductors 51a is arranged at predetermined intervals (almost constant intervals) in the longitudinal direction to be overlapped with a row of the plurality of first contactors 32. The first conductor 51a may also be called a pad.

The periphery of the plurality of first conductors 51a in FIG. 6 is surrounded by an insulating layer 52a (52) such that the plurality of first conductors 51a is not conducted to each other. The shape of the insulating layer 52a surrounding the plurality of first conductors 51a is a ladder shape.

The row of the plurality of first conductors 51a and the insulating layer 52a surrounding the row are provided on both sides interposing the plane CP which passes through the center of the width direction of the first connector 30 and the second connector 40.

In addition, as illustrated in FIG. 6, the third conductor 51c is provided at a position overlapping with the contact position Pb of the first surface 50a with respect to the first contactor 32 in a case where the first surface 50a is viewed in the height direction of the first connector 30 and the second connector 40 (that is, the thickness direction of the PCB 50). The third conductor 51c has a square shape.

Further, FIG. 6 illustrates only a pair of first contactors 32 adjacent to each other in the width direction, and also two contact positions Pc of the pair of the first contactors 32 and two contact positions Pb of the first surface 50a which comes into contact with two contact positions Pc respectively. However, the contact position Pc and the contact position Pb are respectively located to be overlapped with the third conductors 51c.

A plurality of third conductors 51c is arranged in the longitudinal direction at predetermined intervals (almost constant intervals). The intervals at which the plurality of third conductors 51c are arranged in the longitudinal direction are the same as those at which the plurality of first conductors 51a are arranged and those at which the plurality of first contactors 32 are arranged.

An insulating layer 52c (52) is provided to surround the vicinity of the plurality of third conductors 51c such that the plurality of third conductors 51c is not conducted to each other. In addition, in the example of FIG. 6, two rows including the plurality of third conductors 51c are adjacent with a gap in the width direction. Therefore, the shape of the insulating layer 52c (52) surrounding the plurality of third conductors 51c is a lattice shape. The insulating layers 52a and 52c (52) are formed of a synthetic resin material such as an epoxy resin.

As can be seen from FIG. 6, the second conductor 51b is provided between the insulating layer 52a of the plurality of first conductors 51a and the insulating layer 52c in the vicinity of the plurality of third conductors 51c. The first conductor 51a, the second conductor 51b, and the third conductor 51c can be configured as a conductor pattern on the insulating layer 52 in the manufacturing process of the PCB 50, in other words, by the same process, for example, etching of one conductor layer. In this case, the third conductor 51c together with the first conductor 51a and the second conductor 51b can be obtained with comparative ease and at a low cost.

In addition, the first surface 50a is covered with a resist 53 except an area An including the row of the plurality of first conductors 51a and the insulating layer 52a in the vicinity thereof. The area An may be called an exposure area or a non-coated area. The resist 53 is an example of the insulating film. In this manner, it is possible to improve a protection performance of the second conductor 51b and the third conductor 51c by covering the first surface 50a with the resist 53 except the area An. In addition, when a metal plating process is performed on the first conductor 51a, the resist 53 can function as a mask which covers the second conductor 51b and the third conductor 51c. Therefore, it is possible to prevent that a metal material is wasted compared to a case where the second conductor 51b and the third conductor 51c are covered with a metal plating layer.

When the HDD 100 is operated, the potential of each of the plurality of first conductors 51a is a potential of the power or the signal, and the second conductor 51b is a potential of the ground. In addition, each of the plurality of third conductors 51c is insulated from the first conductors 51a and the second conductor 51b.

As can be seen from FIG. 6, in the embodiment, in plan view of the first surface 50a of the PCB 50, the area of the insulating layer 52 is narrow, and a ratio of the area occupied by the conductor pattern 51 (conductor layer) of the first conductor 51a, the second conductor 51b, and the third conductor 51c is high. Therefore, according to the embodiment, for example, there are advantages that noise resistance is easily improved by an electromagnetic shield.

Hereinbefore, as described above, the PCB 50 in the embodiment includes the third conductor 51c insulated from the first conductor 51a and the second conductor 51b at the position overlapping with the plurality of first contactors 32 (contactors) in the thickness direction. In general, a material of the conductor pattern 51 (conductor layer) such as a metal material hardly transmits the gas such as helium compared to the material of the insulating layer 52 such as a synthetic resin material. Therefore, according to the embodiment, for example, the third conductor 51 is not provided at the position overlapping with each of the plurality of first contactors 32 in the thickness direction, and hardly transmits the gas such as helium in the PCB 50 as much as the third conductor 51c is provided compared to the configuration where the insulating layer 52 is provided at the corresponding position. In addition, according to the embodiment, for example, the noise resistance may be improved by the effect of the electromagnetic shield as much as the third conductor 51c is provided.

In addition, in the PCB 50 of the embodiment, the third conductor 51c which is insulated from the first conductor 51a and the second conductor 51b is provided at the position overlapping with the contact position Pb of the first surface 50a with respect to the first contactor 32 in the thickness direction. Therefore, according to the embodiment, for example, in a case where the resist 53 is not coated or the coated resist 52 is cut out, even when the first contactor 32 and the third conductor 51c are electrically connected, the first contactor 32 is not short-circuited with the ground, the power source, or other signal lines.

In an embodiment, the third conductor 51c is covered with the resist 53 (insulating film). Therefore, according to the embodiment, the noises are prevented from occurring, for example, compared to the configuration that the third conductor 51c is exposed in the first surface 50a, and the first contactor 32 pressed by the second contactor 42 to be deformed elastically and the third conductor 51c are conducted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. In addition, the configurations and shapes of the embodiments may be partially exchanged with other configurations. In addition, the specifications (structures, types, directions, shapes, sizes, lengths, widths, thicknesses, heights, numbers, layouts, positions, materials, etc.) of the configurations and shapes may be appropriately changed.

For example, the electronic device may include any device other than the HDD. In addition, the specifications such as the shape and the size of the electronic device are not limited to the above embodiment. The housing may be air-tightly sealed, or may contain air. In addition, the third conductor may be not covered with an insulating film such as the resist.

What is claimed is:

1. An electronic device, comprising:
   a housing having a first opening;
   an electric component in the housing;
   a circuit board attached to the housing, having an outer surface, covering the first opening, and at least partially exposed to an outside of the housing, the circuit board including a plurality of first conductors exposed to the outside of the housing in the outer surface, and a second conductor that extends along the outer surface and is insulated from the plurality of first conductors; and
   a first connector that is mounted in the outer surface, the first connector including: i) a plurality of contactors electrically connected to the plurality of first conductors, respectively, and ii) a support base having a plurality of second openings that penetrates through the support base in a thickness direction of the circuit board and supporting the plurality of contactors such that the plurality of contactors is elastically deformable in the second openings, wherein
   the circuit board further includes a plurality of third conductors at positions overlapping with the plurality of contactors, respectively, the plurality of third conductors being insulated from the plurality of first conductors and the second conductor.

2. The electronic device according to claim 1, wherein the outer surface of the circuit board has a plurality of contact positions at which the plurality of contactors is pressed by a second connector and elastically deforms, wherein each of the plurality of contactors comes into contact with the second connector when the first connector and the second connector are connected to each other, and
   the plurality of third conductors overlaps with the plurality of contact positions, respectively, as viewed in the thickness direction.

3. The electronic device according to claim 1, wherein the plurality of third conductors is covered with an insulating film.

4. The electronic device according to claim 1, wherein the housing is hermetically sealed.

5. The electronic device according to claim 4, wherein the housing contains a gas that is not air.

6. The electronic device according to claim 4, wherein the electric component is a hard disk drive.

7. The electronic device according to claim 1, wherein the plurality of third conductors is surrounded by an insulating layer in a lattice shape.

8. The electronic device according to claim 1, wherein the second conductor is grounded.

9. The electronic device according to claim 1, wherein the plurality of first conductors, the second conductor, and the plurality of third conductors are made of the same material and are on a common layer of the circuit board.

10. An electronic device, comprising:
    a housing that encloses a sealed volume, having an exterior surface with an opening portion where a conductor passes from inside to outside;
    an electric component in the housing; and
    a circuit board covering the opening portion of the housing, the circuit board including an outer surface covered primarily with a metal layer, the metal layer including a plurality of first conductors and a second conductor isolated from the plurality of first conductors, and a first connector that is mounted in the circuit board and includes a plurality of contactors electrically connected to the plurality of first conductors, respectively, and a support base having a plurality of second openings that penetrates through the support base in a thickness direction of the circuit board and supporting the plurality of contactors such that the plurality of contactors is elastically deformable in the second openings, wherein
    the metal layer further includes a plurality of third conductors at positions overlapping with the plurality of contactors, respectively, the plurality of third conductors being insulated from the plurality of first conductors and the second conductor.

11. The electronic device according to claim 10, wherein the outer surface of the circuit board has a plurality of contact positions at which the plurality of contactors is pressed by a second connector and elastically deforms, wherein each of the plurality of contactors comes into contact with the second connector when the first connector and the second connector are connected to each other, and the plurality of third conductors overlaps with the plurality of contact positions, respectively, as viewed in the thickness direction.

12. The electronic device according to claim 10, wherein the plurality of third conductors is covered with an insulating film.

13. The electronic device according to claim 10, wherein the housing is hermetically sealed.

14. The electronic device according to claim 13, wherein the housing contains a gas that is not air.

15. The electronic device according to claim 13, wherein the electric component is a hard disk drive.

16. The electronic device according to claim 10, wherein the plurality of third conductors is surrounded by an insulating layer in a lattice shape.

17. The electronic device according to claim 10, wherein the plurality of first conductors, the second conductor, and the plurality of third conductors are made of the same material and are on a common layer of the circuit board.

18. A method of making an electronic device, comprising:
providing a convex base having an opening;
attaching an electric component to an inner portion of the convex base;
attaching a printed circuit board over the opening and sealing the opening with the printed circuit board; and
removing air via a vent hole, wherein
the printed circuit board comprises an outer surface covered primarily with a metal layer, the metal layer including a plurality of first conductors and a second conductor isolated from the plurality of first conductors, and a first connector that is mounted in the printed circuit board and includes a plurality of contactors electrically connected to the plurality of first conductors respectively, and a support base having a plurality of second openings that penetrate through the support base in a thickness direction of the printed circuit board and supporting the plurality of contactors such that the plurality of contactors is elastically deformable in the second openings, and
the metal layer further includes a plurality of third conductors at positions overlapping with the plurality of contactors, respectively, wherein the plurality of third conductors is insulated from the plurality of first conductors and the second conductor, and the plurality of first conductors, the second conductor, and the plurality of third conductors are formed from the same layer by an etching process.

* * * * *